United States Patent
Tabatabaei (10) Patent No.: US 7,843,771 B2
(45) Date of Patent: Nov. 30, 2010

(54) HIGH RESOLUTION TIME INTERPOLATOR

(75) Inventor: Sassan Tabatabaei, Sunnyvale, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 412 days.

(21) Appl. No.: 11/956,530

(22) Filed: Dec. 14, 2007

(65) Prior Publication Data

US 2009/0154300 A1 Jun. 18, 2009

(51) Int. Cl.
G04F 8/00 (2006.01)
G04F 10/00 (2006.01)
H03K 5/22 (2006.01)

(52) U.S. Cl. .................. 368/118; 327/27; 702/176

(58) Field of Classification Search .......... 368/113, 368/118–121; 327/27, 93; 702/79, 89, 176
See application file for complete search history.

(56) References Cited

U.S. PATENT DOCUMENTS

| | | | | |
|---|---|---|---|---|
| 4,242,637 A * | 12/1980 | Ferguson | ............... | 327/27 |
| 4,301,360 A * | 11/1981 | Blair | ............... | 377/20 |
| 4,362,394 A * | 12/1982 | Menlove | ............... | 368/118 |
| 4,504,155 A * | 3/1985 | Ruggieri | ............... | 368/121 |
| 4,769,798 A * | 9/1988 | Hayashi | ............... | 368/121 |
| 4,772,843 A * | 9/1988 | Asaka et al. | ............... | 368/113 |
| 4,908,784 A * | 3/1990 | Box et al. | ............... | 702/176 |
| 4,975,636 A * | 12/1990 | Desautels | ............... | 324/121 R |
| 4,982,350 A * | 1/1991 | Perna et al. | ............... | 702/89 |
| 5,200,933 A * | 4/1993 | Thornton et al. | ............... | 368/113 |
| 5,717,659 A * | 2/1998 | Besesty | ............... | 368/113 |
| 5,790,480 A * | 8/1998 | Klatser | ............... | 368/121 |
| 6,091,671 A | 7/2000 | Kattan | | |
| 6,137,749 A * | 10/2000 | Sumner | ............... | 368/113 |
| 6,194,925 B1 * | 2/2001 | Kimsal et al. | ............... | 327/132 |
| 6,621,767 B1 * | 9/2003 | Kattan | ............... | 368/113 |
| 6,819,117 B2 * | 11/2004 | Wilsher | ............... | 324/601 |
| 7,460,441 B2 * | 12/2008 | Bartling | ............... | 368/118 |
| 2001/0028262 A1 * | 10/2001 | Kimsal et al. | ............... | 327/133 |

* cited by examiner

*Primary Examiner*—Vit W Miska
(74) *Attorney, Agent, or Firm*—Dority & Manning, PA (57) ABSTRACT

The present subject matter is directed to a high-speed high resolution and accuracy time interpolator circuit. The interpolator uses basic dual ramp time-to-digital converter architecture, but provides circuits and methodologies to improve the accuracy, reduce the effective intrinsic jitter, and reduce the measurement time. Improved aspects of the present subject matter correspond to the introduction of a current mirror for improved settling time, a high frequency clock for improved resolution and ADC sample processing to improve resolution and accuracy.

13 Claims, 3 Drawing Sheets

HIGH RESOLUTION TIME INTERPOLATOR

FIELD OF THE INVENTION

The present subject matter relates to timing measurement. More particularly, the present subject matter concerns high accuracy timing in conjunction with Time Interval Analyzer (TIA) methodologies.

BACKGROUND OF THE INVENTION

High accuracy timing parameter measurements are necessary to analyze and qualify devices and signals in a wide variety of electronic application. Such applications include clocks, PLLs, serial I/O jitter, skew, etc. A number of strategies have been used in practice for such measurements, including real-time oscilloscopes, equivalent-time oscilloscopes, offset frequency digital or analog under-sampling, and time interval analysis. Although each method has its own pros and cons for specific applications, TIA methods provide fairly general timing/jitter measurement methodologies that provide high accuracy with fast measurement times that cover a wide variety of applications.

TIAs are grouped into two general types: Start-to-Stop time interval analyzers and time stamp analyzers. Start-to-Stop time interval analyzers correspond to devices where only the timing of a START event is measured relative to a previous STOP event. Time stamp analyzers, often referred to as "time stampers," correspond to instruments where all event timings are measured relative to a unique reference.

A more advanced form of time stamper is a continuous time interval analyzer (CTIA). CTIAs include a continuously running arming circuit to select events to be measured in a programmable fashion as well as potentially having more than one time stamper to measure the timing of multiple events that can be arbitrarily close in time in one measurement.

Most TIAs, whether continuous or not, include at least one high-resolution time interval measurement circuit. Such circuits include a reference clock counter to count the number of a precise clock cycles within the time interval of interest and an interpolator to measure any residual time less than one cycle of the reference clock. Multiple circuit techniques have been used to implement such circuits. These techniques generally include delay chain techniques, vernier delay line methodologies, vernier oscillator implementations, and time to voltage converter techniques.

Delay chain techniques quantize the time interval with a quantization step equivalent to a unit gate delay. The resolution of such method is usually limited to a few tens of picoseconds.

Vernier delay line methods use the delay difference between two delay elements to quantize time. They provide higher measurement resolution, but may suffer from excessive non-linearity and limited measurement range. This is more suitable for on-chip implementations due to large number of delay elements required.

Vernier oscillator methods rely on the difference between two oscillators' periods to quantize given time interval. Several implementations have been proposed in the literature. This method requires oscillators that can be switched on and off quickly without incurring significant noise and time-dependent non-linearity.

Time to voltage converters (TVC) are generally configured to charge or discharge a capacitance during the time interval of interest. The resulting voltage at the end of the time interval indicates the time interval or it's residual relative to a reference clock. A number of implementations have been proposed in the literature. Among the above methods, the TVC methods lend themselves more easily to off-chip implementation, however, a need remains for improvements in accuracy and resolution while providing short measurement time.

Continuous time interval analyzers (CTIA) such as Guidetech GT4000 use time stamping, arming, and event tracking for performing a wide variety of timing/jitter measurements accurately and quickly. One major part of the GT4000 is a time stamp generator (TSG), which measures the timing of an event of interest in a signal with very high resolution and precision. The combination of time stamp and event number forms a time tag for an event.

Figure 1:
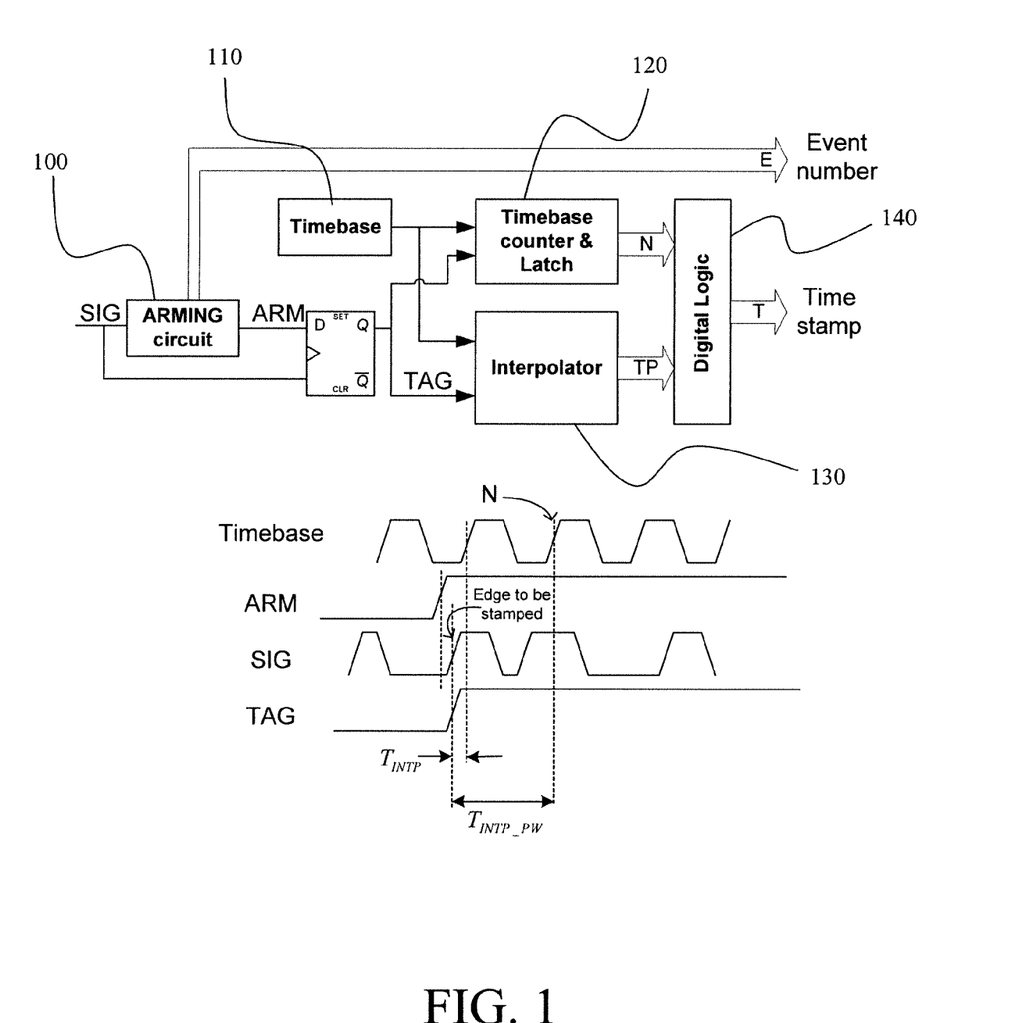
FIG. 1 schematically and diagrammatically illustrates a time sampling architecture representing general time stamp generator operation and representative circuitry.

An exemplary time stamp generator (TSG) operation is shown in FIG. 1. Those of ordinary skill in the art would appreciate that in accordance with such operation an arming circuit 100 selects an edge to be stamped. The TSG uses an accurate and stable time base 110 and a counter 120 to measure the event timing with a resolution of one time base cycle. An interpolator circuit 130 then measures the event timing to the closest subsequent edge of the time base. The combination of interpolator 130 and time base counter 120 allow measurement of the timing of the selected edge. Digital Logic circuit 140 is configured to combine signal N from counter 120 with signal TP from Interpolator 130 to produce Time Stamp T. A typical timing measurement instrument may include more than one TSG to allow measuring parameters that require stamping two or more edges that may be very close to each other.

The interpolator resolution and inherent error specify the major parameters of the TSG. Today's high speed clocks and serializer/deserializer (SERDES) devices require better than 1 picosecond resolution and precision to perform meaningful measurements. Also, high effective sampling rate of the time tag generator is desired because it increases test throughput for some measurements, such as single period measurements. It can also substantially improve measurements such as phase noise, and jitter separation and filtering.

Time-to-voltage based interpolator circuit architecture is known which allows measuring the edge timing with high accuracy within a few picoseconds and fairly quickly within a few hundred nanoseconds. Such known circuitry is exemplified by U.S. Pat. No. 6,091,671 to Shalom Kattan, which is assigned to the owner of the present subject matter and incorporated herein by reference for all purposes. However, to address the growing need of today's high-speed signal test requirements, it has become desirable to improve the resolution, accuracy, and precision to better than 1 picosecond and measurement time of less than 100 nanoseconds.

While various implementations of time interpolators have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, improved high-resolution and high-speed interpolator apparatus and methodologies for use with time interval analyzers (TIA) and continuous time interval analyzers (CTIA) have been provided. It should be appreciated by those of ordinary skill in the art, however, that although the presently disclosed interpolator is described herein as being used with TIAs and CTIAs, such is not a specific limitation of the disclosure as the interpolator may well be used in alternate configurations. For example, the interpolator disclosed herein may be used as a portion of an analog to digital converter where a counter or other device provides a first value indicative of a variable to be measured while the interpolator provides a second, fractional value that may be combined with the first value to produce a more precise final value.

In an exemplary configuration, a high resolution interpolator of both reduced size and cost is provided that provides improved resolution and accuracy to less than 1 picosecond.

In one aspect, a single voltage ramp is employed to convert time into voltage and a high resolution analog to digital converter (ADC) is employed to digitize the results.

Another positive aspect of the presently disclosed device is that a current mirror is employed providing improvements in both settling time and mirror current matching characteristics.

In accordance with aspects of certain embodiments of the present subject matter, high-speed high-resolution ADCs are provided to simplify and accelerate the sampling operation.

In accordance with yet additional aspects of further embodiments of the present subject matter, ADC wait time to acquire a first valid sample is reduced by clocking the ADC with a delayed version of the timebase clock.

According to yet still other aspects of additional embodiments of the present subject matter, methodologies have been developed to use the ADC samples during interpolation initialization to calibrate any settling residual error.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with an improved high resolution interpolator suitable for use with continuous time interval analyzers (CTIA).

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

The following definitions have been employed in conjunction with the remainder of the description of the present subject matter:

$T_{TB}$ Timebase average period.

$f_{TB}=1/T_{TB}$ Timebase average frequency.

$T_{INTP}$ The timebase residual time. This is the time between the selected input edge and the following timebase rising edge and determines the edge timing relative to the timebase.

$T_{INTP\_PW}=T_{TB}+T_{INTP}$ The interpolator input pulse width. It starts with a selected input edge and ends with the second following rising edge of the timebase. The main capacitor is discharged during this time.

$\Gamma_V$ Time to voltage conversion gain of the interpolator. This represents the first degree variations of main capacitor (C0) voltage at the end of the interpolator pulse width to the variation of the timebase residual time $T_{INTP}$.

Reference will now be made in detail to the presently preferred embodiments of the subject high resolution interpolator. Referring again briefly to, FIG. 1, it will be seen from the following that the present subject matter relates, in part, to an improved interpolator that may be used as interpolator 130.

Figure 2:
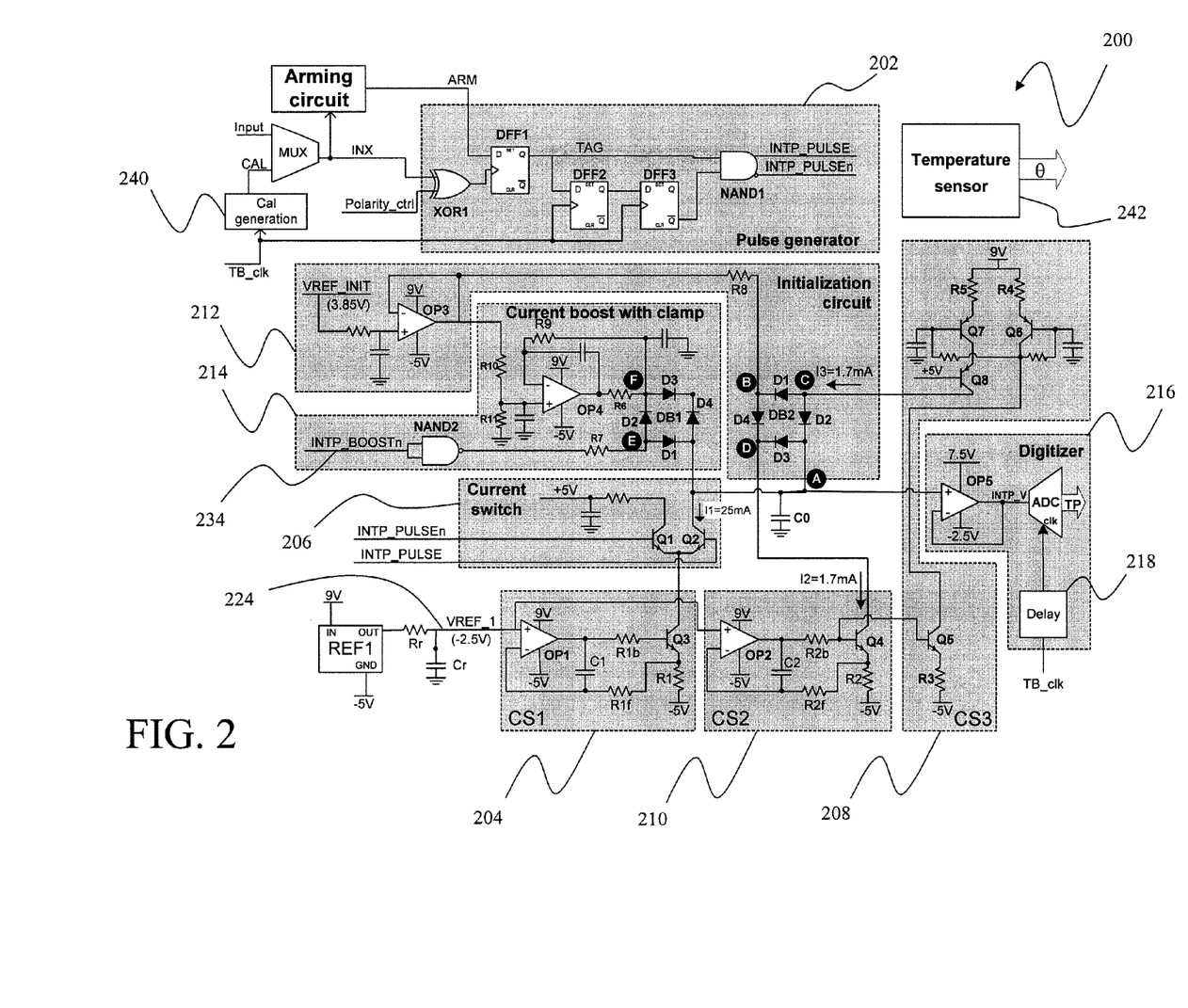
FIG. 2 illustrates a schematic representation of an exemplary high-resolution high-accuracy interpolator in accordance with present technology.

With reference now to FIG. 2, there is illustrated an exemplary high resolution and high accuracy interpolator circuit 200 constructed in accordance with the present subject matter. The present circuit is based on the interpolator previously used in the GT4000 produced by Guide Technology Inc. In accordance with present technology, however, interpolator 200 of the present subject matter incorporates a single voltage ramp to convert time to voltage and a high resolution ADC to digitize the results. In addition, however, to achieve the previously discussed aspects of the present subject matter, certain modifications to the previously provided circuitry have been implemented.

These modifications include the provision of a current mirror as a portion of the current source (CS3) 208. The use of a current mirror provides much faster settling time and better current matching characteristics than previous configuration. In an exemplary embodiment of the present subject matter, the timebase clock frequency is set to be 100 MHz. At this timebase frequency, better than 1 picosecond (ps) resolution is achievable with a 14-bit ADC. The use of such a timebase frequency also reduces the measurement time.

Further in accordance with present technology, the use of high-speed high resolution 100 MHz 14-bit pipelined ADC allows the ADCs to regularly sample the interpolator output voltage INTP_V. This greatly simplifies and also accelerates the sampling operation. Clocking the ADC with a delayed version of the timebase clock by delay element 218 reduces the ADC wait time to acquire the first valid sample and allows use of the ADC samples during the interpolator initialization region to calibrate any settling residual error.

In accordance with the present subject matter, interpolator 200 of the present technology may correspond to a number of sub-circuits including pulse generator 202, time-to-voltage converter (TVC) current source (CS1) 204, current switch 206, charge-up current source (CS3) 208, diode bridge balance current source (CS2) 210, initialization diode bridge (DB2) and reference voltage buffer 212, current boost with voltage clamp 214, and digitizer 216. Each of these sub-circuits are briefly described in the following sections.

Pulse generator 202 includes flip-flops DFF1, DFF2, DFF3, and two gates NAND1 and XOR1 configured as illustrated in FIG. 2. In an exemplary implementation the logic elements may correspond to ECL type devices to support high-speed operation. Pulse generator 202 generates a pulse at the differential output INTP_PULSE that starts by a selected edge of the input signal, and ends with the following second rising edge of the timebase. The width of this pulse, $T_{INTP\_PW} = T_{TB} + T_{INTP}$, determines the timing of the selected edge relative to a timebase edge or $T_{INTP}$. The XOR1 gate selects the rising or falling edge of input signal INX for triggering the pulse. The ARM signal must go HIGH shortly before the selected INX edge.

Time-to-voltage converter (TVC) current source (CS1) 204 is configured to have a high output impedance. Important design considerations for current source 204 include stability and narrow bandwidth. For stability aspects, the feedback through Q3 and C1 should be selected to ensure that the circuit will not oscillate. For bandwidth aspects, the effective bandwidth of the circuit should be reduced as much as possible to reduce the noise contributions of the voltage reference REF1 applied to line 224 and operational amplifier OP1.

Current switch 206 is configured to steer the current I1 from diode bridge DB1 to the main interpolator capacitor C0 during the TVC voltage ramp and away from interpolator capacitor C0 during sampling. In effect, it provides the function of a current switch. As seen in FIG. 2, current I1 may correspond to 25 mA in an exemplary configuration. This circuit is more immune to potentially large glitches that may result from using other types of switches, such as MOSFETs. Transistors Q1 and Q2 should be capable of high-speed switching.

Bridge balance current source 210 is designed similar to high output impedance current source 204, but with a smaller DC output current. This current is nominally equal to current I3 generated by current source 208. In an exemplary configuration as illustrated in FIG. 2, current I3 may correspond to 1.7 mA. The principal function of bridge balance current source 210 is to supply current to the diode bridge DB2 to balance the diode bridge when initializing the voltage at node A to a reference voltage at node B. The design criteria are similar to those of current source 204.

Charge-up current source 208 is constructed using a current mirror transistor pair Q6, Q7 with control transistor Q5 thereby ensuring that its current tracks current I2 from bridge balance current source 210 very closely. This is a significant aspect for the present circuit in that it ensures that currents I2 and I3 can balance diode bridge DB2 and initialize the voltage at node A, V_A, to a voltage very close to the voltage at node B. In an exemplary configuration a radio frequency (RF) PNP type transistor is used for the optional transistor Q8. This transistor yields faster interpolator settling, and less non-linearity due to its smaller collector-base capacitance although it increases temperature sensitivity slightly due to its base current.

The initialization diode bridge circuit and reference voltage buffer 212 initialize the voltage on capacitor C0 to a constant voltage before starting to measure any time stamp. An advantage of this type of circuit configuration over switch based ones is the lack of significant glitches. In an exemplary configuration the operational amplifier OP3 of reference voltage buffer 212 should be a low noise device. One method of reducing operational amplifier OP3 noise is to limit the bandwidth, however, limiting bandwidth of the operational amplifier OP3 unity gain buffer increases the settling time of the circuit. Given these design consideration, operational amplifier OP3 should be selected for optimal combination of bandwidth, settling time, and intrinsic noise. In an exemplary configuration, diode bridge DB2 is an HSMS-2828 type device with four bridge connected diodes.

The current boost with voltage clamp sub-circuit 214 is activated by a pulse on INTP_BOOSTn signal from pulse generator 202 applied to input line 234. NAND gate NAND2 is a fast chip that supports TTL levels. When its output goes high, diode D1 of diode bridge DB1 turns on and conducts significant current to capacitor C0. Once the voltage on capacitor C0 gets close to the voltage on node F of diode bridge DB1, diode D2 of diode bridge DB1 starts turning on and a larger portion of NAND2 output current starts flowing through diode D2 of diode bridge DB1, until diode D1 of diode bridge DB1 goes to the OFF region.

The current steering from diode D1 to diode D2 effectively clamps the voltage on capacitor C0. This is important to ensure that when INTP_BOOSTn is disabled, diode DB2 can fairly quickly settle the voltage on capacitor C0 to the long-term steady state voltage. In practice, fast rise time at NAND gate NAND2 output may cause an overshoot on node A. One solution is to reduce the clamp reference voltage on node F. One method for reducing overshoot is to use the voltage divider R7/R8 to reduce the VREF_INIT to an optimal value, which is determined through simulations.

Digitizer 216 includes a high bandwidth buffer and a high resolution high speed ADC. This circuit is an important part of interpolator 200 because it determines the resolution and also a large part of the noise behavior of the circuit. Significant aspects to be considered for operational amplifier OP5 include its bandwidth, intrinsic noise, and high input impedance.

Important attributes of the ADC include support of adequate full scale voltage. In an exemplary configuration, such full scale voltage may be 2V. This full-scale range leaves sufficient margin to ensure that the entire voltage variation on capacitor C0 falls within the ADC full scale range even in the presence of tolerances of capacitor and resistor values as well as parasitic capacitors of the active devices in the I1, I2, and I3 current paths. Further, in exemplary configurations, the ADC may include 14 bit resolution to achieve better than 1 ps resolution, support a 100 Msps sampling rate, have a high signal-to-noise ratio (SNR) as such directly impacts the intrinsic jitter of the interpolator, and be rated for a power consumption of less than 0.5 W to reduce the overall power requirements of the board. It would also be advantageous to provide the ADC in a small package to reduce PCB footprint and to provide two ADCs in one package while insuring sufficient cross-coupling isolation between the ADCs.

An important parameter of the interpolator that directly relates to the ADC is the interpolator TVC gain. TVC gain $\Gamma_V$ is defined as the voltage variation at node INTP_V at the input of the ADC of digitizer 216 due to the variations of the interpolator input pulse width, as follows:

$$\Gamma_V = \frac{\Delta V_{INTP\_V}}{\Delta T_{INTP}} \quad \text{Eqn. 1}$$

where $\Delta V_{INTP\_V}$ is the voltage variations at the ADC input for the time variation corresponding to the $\Delta T_{INTP}$. Maximizing gain $\Gamma_V$ will improve resolution and decrease the interpolator intrinsic jitter.

A number of high-speed pipelined 14-bit ADC may be selected for this application. The ADC signal-to-noise ratio (SNR) of greater than 75 dB improves the intrinsic jitter of the interpolator. However, it typically results in significant power consumption. An alternative is to use ADC with lower SNR and then reduce the effective intrinsic jitter by averaging multiple samples of the ADC.

Temperature coefficient is another important factor in selecting the ADC. Large temperature coefficients can significantly degrade the interpolator static accuracy specifications.

Figure 3:
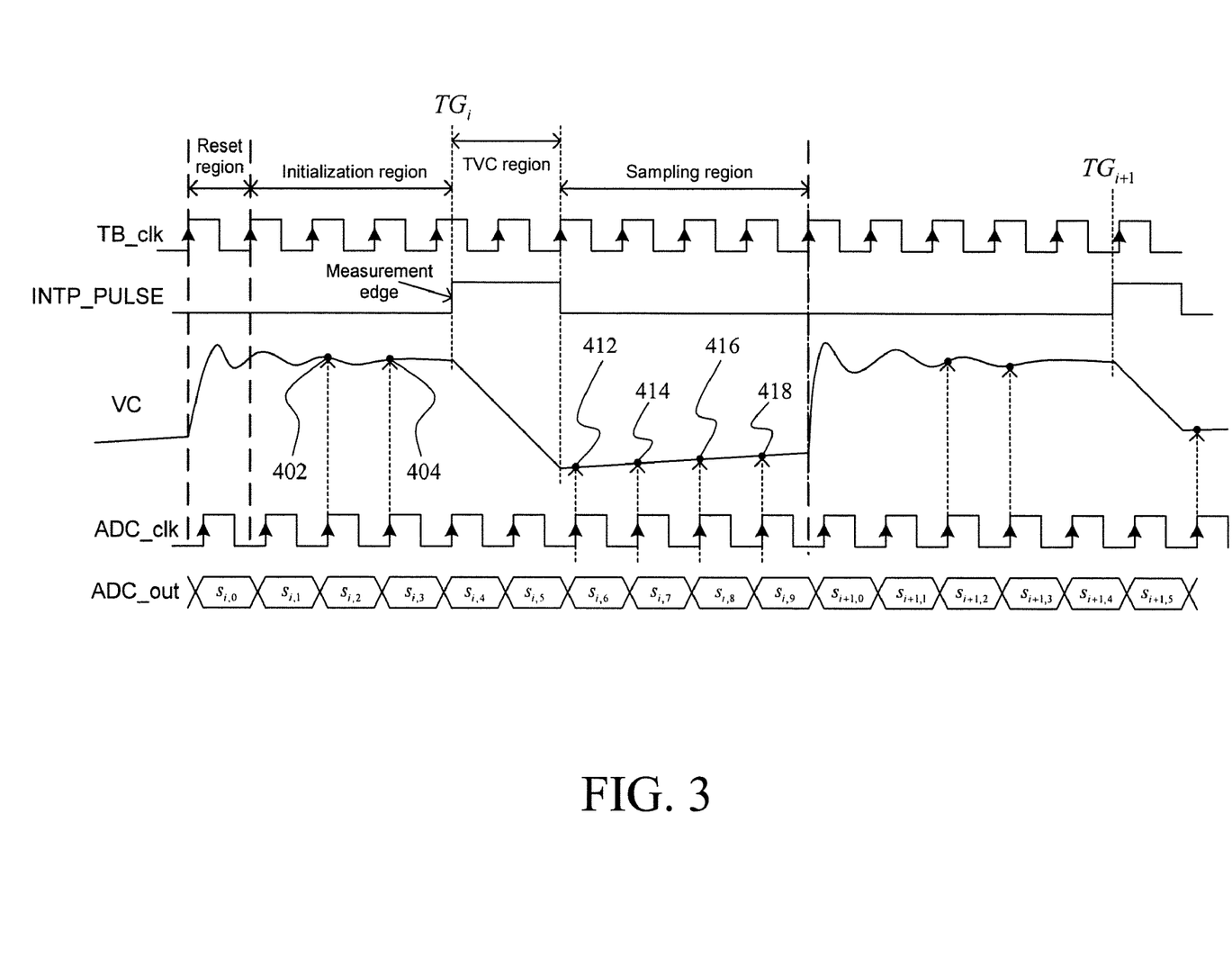
FIG. 3 shows several waveforms illustrating an exemplary operation of the interpolator in accordance with present technology.

With reference now to FIG. 3, the waveforms shown illustrate the operation of interpolator 200 in accordance with the present subject matter. The operation of interpolator 200 can be divided into four different regions corresponding to initialization, time-to-voltage conversion (TVC), sampling, and reset. Each of these regions are explained as follows.

Measuring a time tag starts by initializing capacitor C0 to the reference voltage $V_{INIT}$, which is very close to Vref_INIT. To do so, upon completion of the a measurement, the reset circuit composed of the operational amplifier OP4 buffer, DB1, NAND2, and signal INTP_BOOSTn supplies significant amount of current to capacitor C0 through D1 of diode bridge DB1 to charge capacitor C0 to $V_{INIT}$. After the reset, the INTP_BOOSTn signal goes HIGH and the circuit enters initialization region, where all diodes in diode bridge DB1 are off and INTP_V voltage is allowed to settle for a programmable number of cycles.

As illustrated in exemplary FIG. 3, only three cycle settling is shown but it should be appreciated by those of ordinary skill in the art that more or less settling cycles may be selected. Assuming I2=I3 and all diodes in diode bridge DB2 are matched, during initialization depending on whether V_A is greater or less than V_B, I2 or I3, discharges or charges capacitor C0, respectively. Subsequently, V_A gets closer to V_B and all four diodes in diode bridge DB2 turn on. Eventually, half of current I3 flows through diodes D1 and D4 of diode bridge DB2 and the other half through diodes D2 and D3 of diode bridge DB2 to join at node D and flow to I2. This balances diode bridge DB2 and sets the voltage at node A to the same value as node B. In practice small mismatches of diodes, and also I2 and I3 mismatches will cause V_A to be initialized to a voltage that may be slightly different from V_B. This does not degrade the interpolator performance as long as the mismatches are small enough to ensure all four diodes in DB2 turn on.

Settling time in the initialization region, $T_{INTP\_settle}(V_{err})$, is defined as the time needed to ensure that V_A reaches to within $V_{err}$ of its steady state voltage, i.e., the voltage if the circuit had been allowed to settle indefinitely. In accordance with present subject matter, use of current mirror circuit for current source CS3 208 leads to a relatively fast settling time at interpolator node A. From simulation results, V_A settles to within 0.1 mV of the quiescent voltage within 100 ns.

A feature of interpolator 200 constructed in accordance with the present subject matter is the use of ADC samples during initialization region to estimate the capacitor voltage at the time the measurement edge arrives, i.e., when the TVC region begins. Exemplary samples are illustrated at 402 and 404. Subtracting a voltage derived from the estimated initial voltage from the samples during the sampling region effectively reduces the error due to any residual voltage at node INTP_V. This residual voltage may be due to settling behavior of the voltage at INTP_V node, or low frequency random noise. More than one sample in the "initialization region" may be needed for effective reduction of such errors. Although only two samples are illustrated in FIG. 3, the number of samples taken in initialization region may be programmable to reduce the random noise impact in a programmable fashion. In an exemplary configuration, a function to derive the voltage from the samples in the initialization region, which would reduce the error when subtracted from the samples in the sampling region will be obtained during calibration. In the simplest form, this function may be averaging, but it may be more complex depending on the nature of settling behavior.

Effective processing of the samples is important to ensure fast throughput. For example, the samples can be fed serially into a real-time FIR filter or shift register based polynomial calculator constantly. Upon start of the TVC region, the value in the serial computation engine is latched for further use. The computation engine could be implemented in the same circuit, e.g., FPGA that reads ADC samples directly. Settling time related error calibration strategies are described herein below.

Upon initializing capacitor C0 voltage (V_A), interpolator 200 is ready to receive an INTP_PULSE pulse. The flip-flops DFF1, DFF2, DFF3 of pulse generator 202 generate a positive pulse at INTP_PULSE starting with the edge of interest (measurement edge) in the signal and ends with the second timebase edge immediately following the measurement edge. This pulse causes the substantially constant current I1 minus I3 to discharge capacitor C0. At the end of the INTP_PULSE, transistor pair Q1, Q2 stops the I1 current flow from capacitor C0 by redirecting it to transistor Q1. The V_A voltage at the end of the INTP_PULSE is a substantially linear function of the INTP_PULSE width, $T_{INTP\_PW}$. V_A is buffered through operational amplifier OP5 to isolate it from the ADC input. The critical voltage of INTP_V at the end of the INTP_PULSE, denoted by $V_{INTP\_V}$, relates to the $T_{INTP}$ as follows:

$$V_{INTP\_V} = V_{INIT} - \frac{(I_1 - I_3) \cdot T_{INTP\_PW}}{C_0} \quad \text{Eqn. 2}$$
$$= \frac{(I_1 - I_3) \cdot T_{INTP}}{C_0} + V_{INTP\_V0}$$

where $V_{INTP\_V0} = V_{INIT} - (I_1 - I_3) \cdot T_{TB}/C_0$ is a constant offset. The $V_{INTP\_V}$ vs. $T_{INTP}$ relationship may include some non-linearity due to the device switching transients, non-linear parasitic capacitances of transistors and diodes, and bandwidth limitations due to operational amplifier OP5. These non-linearities are calibrated for as will be described later herein below. In general, however, the j-th sample of the ADC after the end of interpolator input pulse, $d_S(j)$, is a function of $T_{INTP}$.

At the end of TVC region, current I1 stops flowing through capacitor C0 and the current I3 charges capacitor C0 at a slow rate. In an exemplary configuration the charging rate may be about 10 to 50 times slower than the discharge rate in the TVC region. Sampling the charge up ramp at any ADC clock edge provides information about the location of the measurement edge. In FIG. 3, the ADC outputs are assumed to be generated immediately following the ADC clock edge for the ease of describing the interpolator operation. In practice, however, the ADC outputs may be delayed relative to the sampling point by several cycles due to the pipelined architecture of high-speed ADCs.

The voltage at each sampling point is $V_S(j)=V_{INTP\_V}+V_{SR}(j)$, where $V_{SR}(i)$ is the voltage difference between $V_{INTP\_V}$ and the voltage at the j-th sampling point. $V_{SR}(j)$ can be estimated as follows:

$$V_{SR}(j) = \frac{I_3(\tau_S + j \cdot T_{TB})}{C_0}, \quad j=0, \ldots, M_S-1 \qquad \text{Eqn. 3}$$

where $\tau_S$ is the delay between the end of the TVC region, and the immediately following ADC sampling clock edge, and $T_{TB}$ is the period of the timebase clock. In this design, $\tau_S$ is set to half the timebase clock period to obtain an ADC sample without waiting for a full timebase period. The $\tau_S$ delay can be implemented simply by using negative edges of the timebase clock. If there is excessive jitter on negative edges, then a delay line may be used to delay the ADC sampling edges relative to the time base clock, TB_clk, edges.

For a given value of j, $V_{SR}(j)$ is a nominally constant voltage and can be calibrated out as an offset. In practice, however, $V_{SR}(j)$ may include non-constant terms denoted as $V_{SR\_TVC}(j)$ and $V_{SR\_n}(j)$. $V_{SR\_TVC}(j)$ is a function of $V_{INTP\_V}$. This could be due to different biasing point for various active components connected to the node A as $V_{INTP\_V}$ varies from one measurement to the next. This term effectively either changes the value of interpolator TVC characteristic parameter, $\Gamma_V$, or appears as a source of non-linearity. Both cases will be calibrated during calibration. $V_{SR\_n}(j)$ represents random noise. This noise is due to the different device noises affecting the voltage at INTP_V node, and ADC noise sources.

Previous interpolators use only one sample along the charge up region, which results in direct contribution of $V_{SR\_n}(j)$ in the final measurement which could be significant. To reduce the effect of noise, interpolator 200 in accordance with the present subject matter uses the average of multiple samples along the sampling region. The averaging reduces the noise impact and also increases resolution. The result of averaging ADC samples in the sampling region, $d_T$, can be represented as follows:

$$d_T = \frac{1}{M_S} \sum_{j=0}^{M_S-1} d_S(j) \qquad \text{Eqn. 4}$$

$$= \frac{1}{M_S} \sum_{j=0}^{M_S-1} (V_{INTP\_V} + V_{SR\_c}(j) + V_{SR\_TVC}(j) + V_{SR\_n}(j) + V_q(j))$$

$$= V_{INTP\_V} + f_{M_S}(V_{TVC}) + \frac{1}{M_S} \sum_{j=0}^{M_S-1} (V_{S\_n}(j))$$

where $d_S(j)$ is the ADC output, $V_{SR\_c}(j)$ is the constant part of $V_{SR}(j)$, $f_{M_S}(T_{TVC})$ is nonlinearity caused by non-linear sources in the sampling region, $V_q(j)$ is the ADC quantization noise, and $V_{S\_n}(j)=V_{SR\_n}(j)+V_q(j)$ is the effective noise at the j-th sampling point. The overall noise during sampling is:

$$V_{n\_S} = \frac{1}{M_S} \sum_{j=0}^{M_S-1} (V_{S\_n}(j)) \qquad \text{Eqn. 5}$$

Since $V_{S\_n}(j)$ for $j=0, \ldots, M_S-1$ have independent and identical distributions, the noise power is reduced by a factor of $$\sqrt{M_S}, \text{ i.e., } \sigma_{V_{n\_S}} = \sigma_{V_{S\_n}}/\sqrt{M_S}.$$

Also, the effective average resolution of final estimate improves by a factor of $M_S$ to $q/M_S$, where q is the ADC resolution. This has the effect of increasing the ADC number of bits by $\log_2(M_S)$. In the exemplary waveforms of FIG. 3, $M_S$ is set to a value of four as shown by sample points 412, 414, 416, 418, but it can be programmed to other values to either speed up measurements with lower resolution and precision, or improve the resolution and decrease the noise at the expense of longer measurement time. The effective resolution after averaging is computed as follows:

$$r_{eff}(M_S) = \frac{(V_{FS}/2^b) \cdot (\Delta T_{INTP}/\Delta V_{INTP\_V})}{M_S} \qquad \text{Eqn. 6}$$

where $\Delta T_{INTP}$ is the interpolator range, $V_{FS}$ is the ADC full scale voltage, and b is the ADC bits. The averaging described above can deliver resolution less of less than 0.1 ps.

Upon collection of sufficient ADC samples, current I3 can charge capacitor C0 to a voltage close to VREF_INIT, at which time the interpolator starts the initialization region. However, it can take up to 20 timebase cycles or 200 ns before the interpolator reaches the initialization region. To speed up the interpolator, the circuit composed of NAND2, R6, DB1, OP4, and INTP_BOOSTn signal inject a large current to capacitor C0 in a short period of time. The injected charge ensures that V_A reaches a voltage close to VREF_INIT.

In an exemplary configuration of the present subject matter, NAND2 output generates a 5V pulse as the INTP_BOOSTn pulse is generated. Diode bridge DB1 and voltage source 214 containing operational amplifier OP4 and the passive components around it form a clamp circuit that limits the voltage rise on node A to a value fairly close to VREF_INIT.

In accordance with additional features of the present subject matter, interpolator 200 may be calibrated to compensate for errors based on components parametric variations and temperature. A calibration block 240 generates a clock signal CAL with the frequency of $(M/N) \cdot T_{TB}$, where M are N prime integers relative to each other. A PLL is used to generate this signal which uses the timebase signal as its input. Since M are N are prime relative together, CAL will consistently occur at N equally-spaced locations along the interpolator range, which is equivalent to $T_{TB}$. The calibration procedure may proceed as follows: apply a calibration signal CAL to the interpolator 200, measure time stamp for edges that are apart by a fixed number of events, and record the ADC samples for all edges for the interpolator. The ADC values for every N-th edge are related to the same location in the interpolator edge. These values are separated and averaged to reduce the error due to the CAL jitter and interpolator intrinsic jitter. This results in N ADC codes. Each code is the result of averaging a number of edges for the same location in the interpolator range.

Assuming the N calibration samples are equally spaced, polynomial fitting function can be constructed. The coefficients of the polynomial form the calibration table. Finally, a separate calibration table is built for each choice of ADC sample averaging number. This yields different calibration tables for each selection of number of ADC samples to be averaged in the sampling region.

At highest sampling rate, the interpolator initial voltage settling time may cause a residual error of a few picoseconds. One method to reduce this error is to reduce the settling time, but that may adversely cause increased power consumption or noise. Another method is to sample the capacitor voltage during initialization region and use them to estimate the initialization voltage at the time that the capacitor voltage ramp starts. In most general form, the initialization voltage at the start of the ramp is a function of the samples taken during initialization. This function can be obtained by building a table of settling time induced error versus the samples taken in the initialization region. Using this table, an interpolation function can be obtained.

In the simple form, averaging the samples in the initialization region and subtracting the result from the ADC samples in the sampling region will reduce the settling time error. In this case, the calibration procedure is the same as the one described previously, except that the digital logic circuit, e.g., a field programmable gate arrays (FPGA), is set to perform the initial voltage sampling, averaging, and subtraction. This results in a separate calibration table. This calibration is needed for measurement modes that require high average accuracy but not low intrinsic jitter. If both high average accuracy and low intrinsic jitter is required, larger number of samples in the initialization and TVC regions have to collected and averaged to reduce the interpolator intrinsic jitter.

The interpolator measurement can vary by a few picoseconds over the +/-5° C. operation temperature. Some measurements are less sensitive to this error, such as frequency measurement when the input signal and the timebase are locked to the same source. But, the error may be significant in other applications, such period measurement, especially in unlocked conditions.

To calibrate for temperature, a temperature sensor 242 is placed close to the interpolator and provides a temperature reading θ. During the calibration process, temperature is sensed, digitized, and supplied to a FPGA. The calibration process includes the following steps which provide the calibration coefficients, that are used to calibrate the measurements and which may be stored in a memory associated, for example, with the previously mentioned FPGA or some other independent memory device or a memory device associated with the interpolator or Digital Logic device 140 (FIG. 1):

1. Place the interpolator in an oven. Set the temperature to 15° C. Perform the interpolator calibration as previously described. Save the ADC codes for each interpolator location.
2. Repeat the above for the temperatures 25° C., 35° C., 45° C., 55° C., or other temperatures.
3. Model the difference between the ADC codes versus time curves at different temperatures with two parameters: gain and offset.

The measurement compensation includes the following steps:
1. Read the temperature from temperature sensor.
2. Interpolate the gain and offset variations for any temperature that is not exactly 15° C., 25° C., 35° C., 45° C., 55° C.; otherwise use the gain and offset variations measured in calibration stage.
3. Adjust the gain and offset based on the interpolator calibration tables previously obtained.

This calibration technique assume that temperature affect mainly gain and offset of the interpolator, but not non-linearities. This is a valid assumption as long as the difference between calibration temperature values is not too large.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for providing improved resolution in an interpolator, comprising:
   providing an interpolator comprising a capacitor, a capacitor charging source, and an analog to digital converter;
   applying a sampling charging current from the capacitor charging source to the capacitor to produce a voltage ramp across the capacitor;
   sampling the voltage level across the capacitor with the analog to digital converter a plurality of times as the sampling charging current is applied;
   processing the sampled voltage levels to increase measurement resolution of the capacitor voltage at the application of the sampling charging current; and
   storing a value representing the processed sampled voltage levels.

2. The method of claim 1, wherein processing comprises averaging the plurality of sampled voltage levels.

3. The method of claim 1, further comprising:
   applying an initializing charging current from the capacitor charging current source to the capacitor to produce a voltage across the capacitor;
   sampling the voltage level across the capacitor with the analog to digital converter as the initializing charging current is applied;
   processing the value of the voltage sample to derive a correction value reflecting settling as the initialization charging current is applied; and
   storing the correction value based on the processed values.

4. The method of claim 1, further comprising:
   applying a calibration signal to the interpolator;
   applying a sampling charging current to the capacitor from the charging current source to produce a voltage across the capacitor;

sampling the voltage level across the capacitor with the analog to digital converter as the sampling charging current is applied;

processing the value of the voltage samples taken as the sampling charging current is applied to derive a calibration value; and storing the calibration value based on the processed value.

5. The method of claim 4, wherein sampling the voltage level across the capacitor as the sampling charging current is applied comprises sampling the voltage level across the capacitor a plurality of times as the sampling charging current is applied.

6. The method of claim 5, wherein processing the value of the voltage samples taken as the sampling charging current is applied comprises averaging the plurality of samples.

7. The method of claim 6, further comprising:

creating and storing a calibration table based on the number of samples taken as the sampling charging current is applied and the averages values of the samples.

8. The method of claim 1, further comprising:

associating a temperature sensor with the interpolator;

heating the interpolator to a plurality of predetermined temperatures;

recording measurements from the temperature sensor; and constructing and storing a temperature calibration table based on the recorded measurements and the predetermined temperatures.

9. A method for reducing settling error in an interpolator, comprising:

providing a capacitor:

providing a current mirror charging current source;

charging the capacitor from the current mirror charging current source for a first predetermined time;

providing an analog to digital converter;

sampling the voltage across the capacitor with the analog to digital converter during the first predetermined time;

processing the samples taken during the first predetermined time to derive a correction value;

discharging the capacitor during a measurement interval;

charging the capacitor from the current mirror charging current source during a sampling interval;

sampling the voltage across the capacitor with the analog to digital converter during the sampling interval; and subtracting the correction value from the sampled values taken during the sampling interval, whereby interpolated data values may be derived with reduced error resulting from settling voltages across the capacitor.

10. The method of claim 9, wherein sampling the voltage across the capacitor during the first predetermined time comprises sampling the voltage across the capacitor a plurality of times during the first predetermined time.

11. The method of claim 10, wherein processing the plurality of samples taken during the first predetermined time comprises averaging the plurality of samples.

12. The method of claim 11, wherein sampling the voltage across the capacitor during the sampling interval comprises sampling the voltage across the capacitor a plurality of times during the sampling interval.

13. The method of claim 12, further comprising:

averaging the plurality of samples taken during the sampling interval.

* * * * *